United States Patent
Baek

[11] Patent Number: 5,946,196
[45] Date of Patent: Aug. 31, 1999

[54] DEVICE FOR SECURING A PRINTED CIRCUIT BOARD ASSEMBLY

[75] Inventor: Seung-su Baek, Anyang, Rep. of Korea

[73] Assignee: SamSung Electronics Co., Ltd., Kyungki-do, Rep. of Korea

[21] Appl. No.: 08/895,500

[22] Filed: Jul. 16, 1997

[30] Foreign Application Priority Data

Jul. 16, 1996 [KR] Rep. of Korea ............ 96-21082

[51] Int. Cl.⁶ ............ H05K 7/14; H01R 13/62
[52] U.S. Cl. ............ 361/798; 361/753; 361/796; 361/801; 439/160
[58] Field of Search ............ 361/740, 748, 361/752, 759, 788, 796, 798, 801, 802, 753; 439/152, 157, 159, 160; 211/41.17

[56] References Cited

U.S. PATENT DOCUMENTS

| | | |
|---|---|---|
| 3,767,974 | 10/1973 | Donovan, Jr. et al. . |
| 4,002,381 | 1/1977 | Wagner et al. . |
| 4,313,150 | 1/1982 | Chu . |
| 4,648,009 | 3/1987 | Beun et al. . |
| 4,758,928 | 7/1988 | Wierec et al. . |
| 4,914,552 | 4/1990 | Kecmer . |
| 4,996,631 | 2/1991 | Freehauf . |
| 5,140,501 | 8/1992 | Takahashi et al. . |
| 5,162,979 | 11/1992 | Anzelone et al. . |
| 5,218,519 | 6/1993 | Welch et al. . |
| 5,222,897 | 6/1993 | Collins et al. . |
| 5,266,052 | 11/1993 | Phillips, II . |
| 5,316,500 | 5/1994 | Vanaleck et al. . |
| 5,359,492 | 10/1994 | Porter . |
| 5,363,281 | 11/1994 | Baitz et al. . |
| 5,396,401 | 3/1995 | Nemoz . |
| 5,594,627 | 1/1997 | Le . |
| 5,601,349 | 2/1997 | Holt . |
| 5,640,309 | 6/1997 | Carney et al. . |

Primary Examiner—Leo P. Picard
Assistant Examiner—Jayprakash N. Gandhi
Attorney, Agent, or Firm—Robert E. Bushnell, Esq.

[57] ABSTRACT

A board connecting structure for connecting an auxiliary circuit board to a main circuit board via a connector inside a case is described. A plate is connected to the auxiliary circuit board and a latch is hinge-coupled to the plate. The latch has a prong that fits into a groove formed in the case. One or more slight bumps and corresponding dimples are formed at surfaces of the plate and the latch. The clicks into place in the dimple, as the latch is rotated. At the same time, the prongs of the latch moves into the grove in the case so that the auxiliary circuit board is held in place. The auxiliary circuit board is easily installed into and removed from the connector.

17 Claims, 5 Drawing Sheets

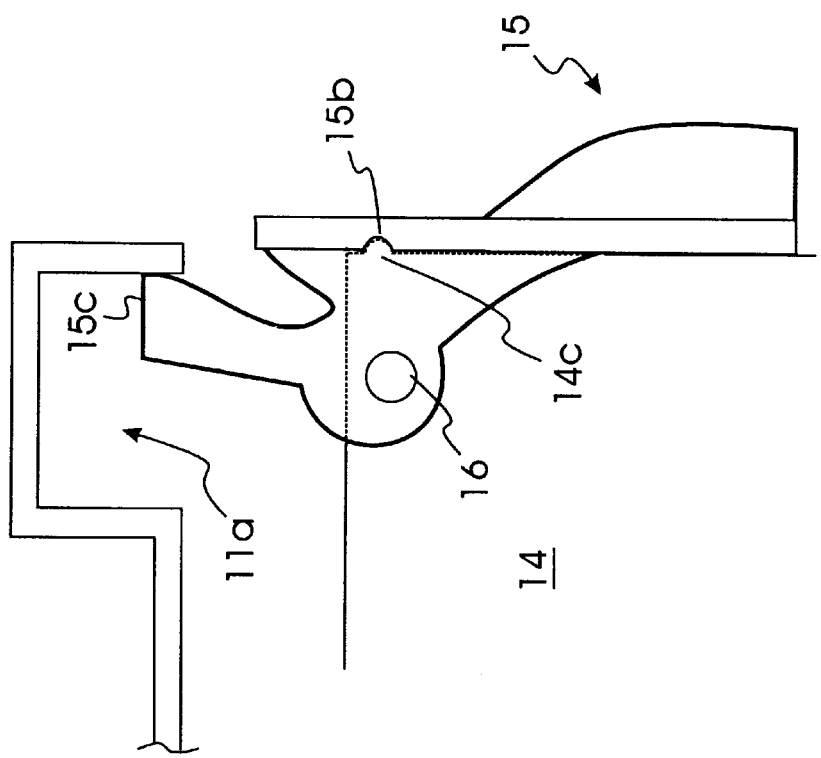
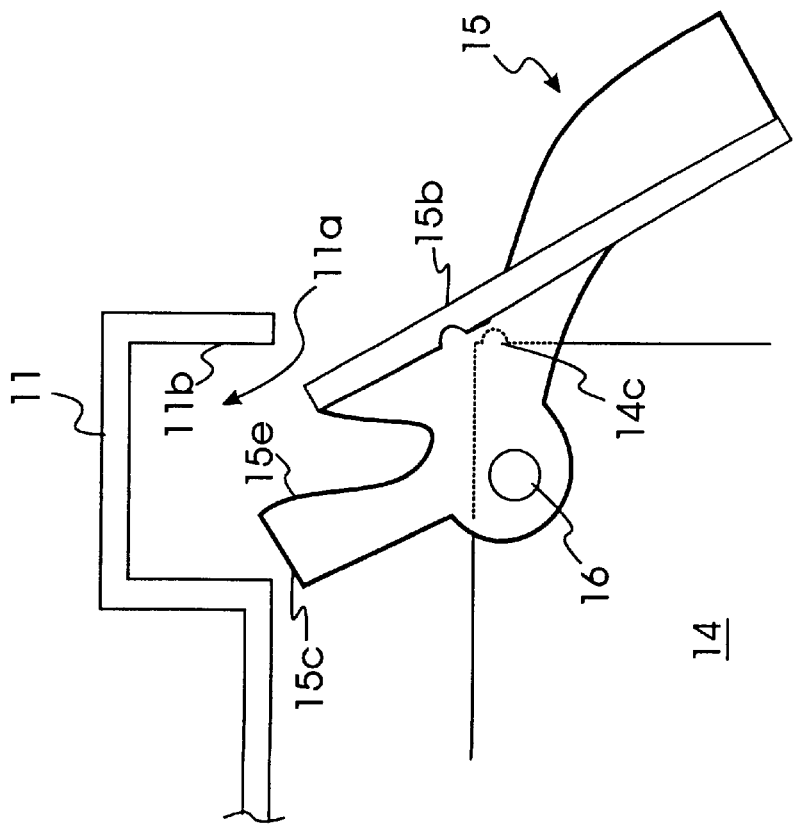

5,946,196

DEVICE FOR SECURING A PRINTED CIRCUIT BOARD ASSEMBLY

CLAIM OF PRIORITY

This application makes reference to, incorporates the same herein, and claims all benefits accruing under 35 U.S.C. §119 from an application for Board Connecting Structure earlier filed in the Korean Industrial Property Office on Jul. 16, 1996 and there duly assigned Serial No. 21082/1996, a copy of the same being attached hereto.

BACKGROUND OF THE INVENTION

1. Field of the Invention

The present invention relates to a PCB assembly connecting structure and, more particularly, to an apparatus a process for securing a printed circuit board assembly that allows for the easy installation and removal of a printed circuit board.

2. Description of Related Art

In a typical computer system, a connector to which an auxiliary device for extending a function is connected is electrically connected to a main circuit board. U.S. Pat. No. 3,767,974 for an Insertion and Extraction Lever for Printed Circuit Cards to Donovan Jr., et al and U.S. Pat. No. 4,313,150 for a Latching Lever for Printed Circuit Boards to Chu, for example, each disclose the insertion and removal of a printed circuit board from a chassis without the use of screws or tools. In addition, they show a handle on the lever parts. I have found however, that there is a need for improving the process and structure used in the latching/unlatching process.

SUMMARY OF THE INVENTION

To overcome the above problems, it is an object to provide a board connecting structure by which an auxiliary circuit board can be easily connected to and disconnected from a connector.

It is also an object to use protrusions and indentations to facilitate the connection and disconnection of the printed circuit board from the chassis.

Accordingly, to achieve the above object there is provided a board connecting structure by which an auxiliary circuit board is installed into and removed from a connector which is electrically connected to a main circuit board inside a case, the board connecting structure including a plate connected to the auxiliary circuit board; and a hooking piece hinge-coupled to the plate and having an end portion to be inserted into a groove formed at the case, in which at least one coupling protrusion is formed on one of the surfaces of the plate and the hooking piece facing each other, and at least one coupling indentation into which the coupling protrusion is fitted is formed on the other of the surfaces of the plate and the hooking piece.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 5a is a side operational view showing the hooking piece in a disengaged position from the case; and FIG. 5b is a side operational view showing the hooking piece in an engaged position with the case.

DETAILED DESCRIPTION OF THE INVENTION

Figure 1:
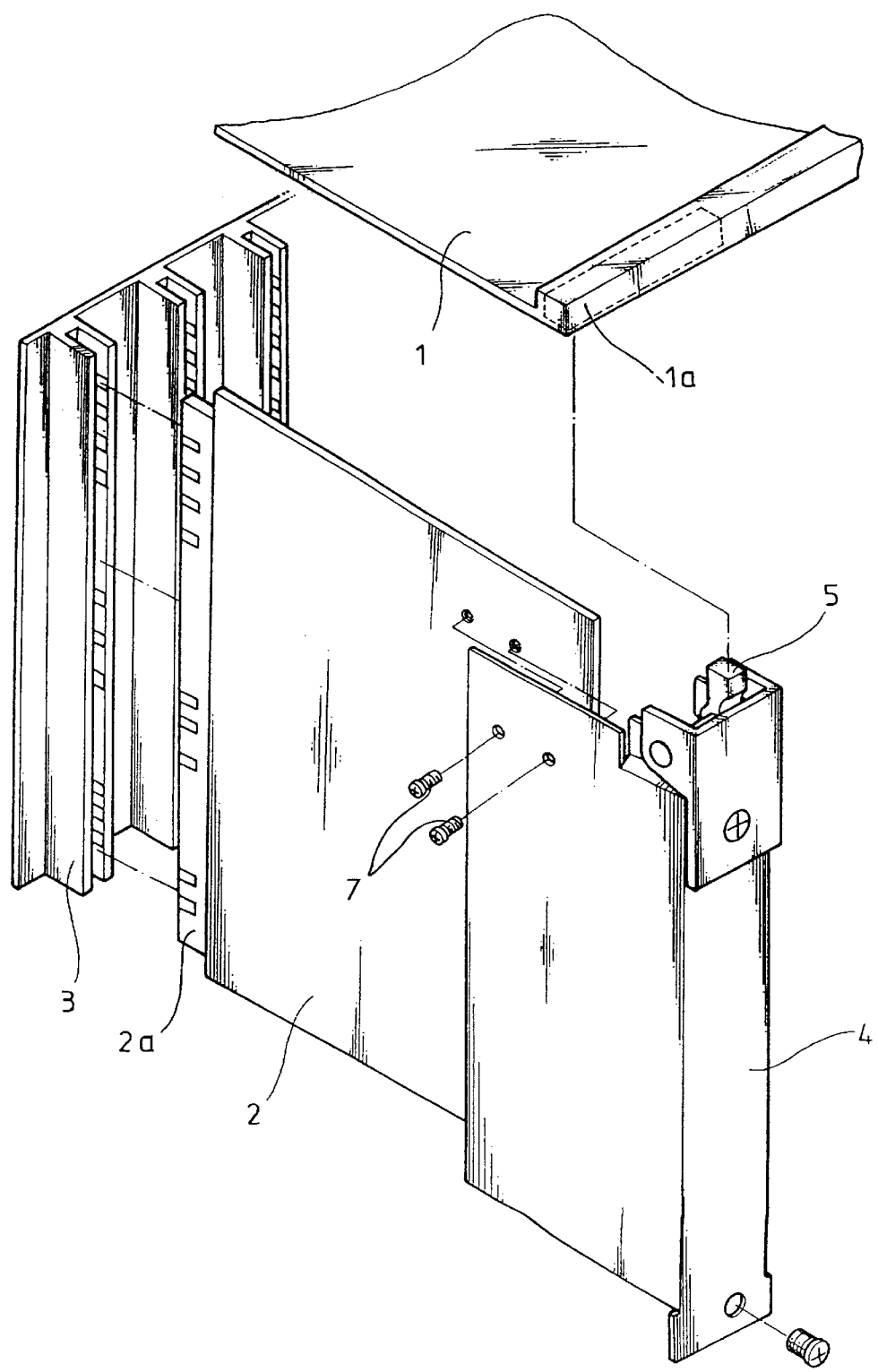
FIG. 1 is an exploded perspective view illustrating connection for a circuit board.
Figure 2:
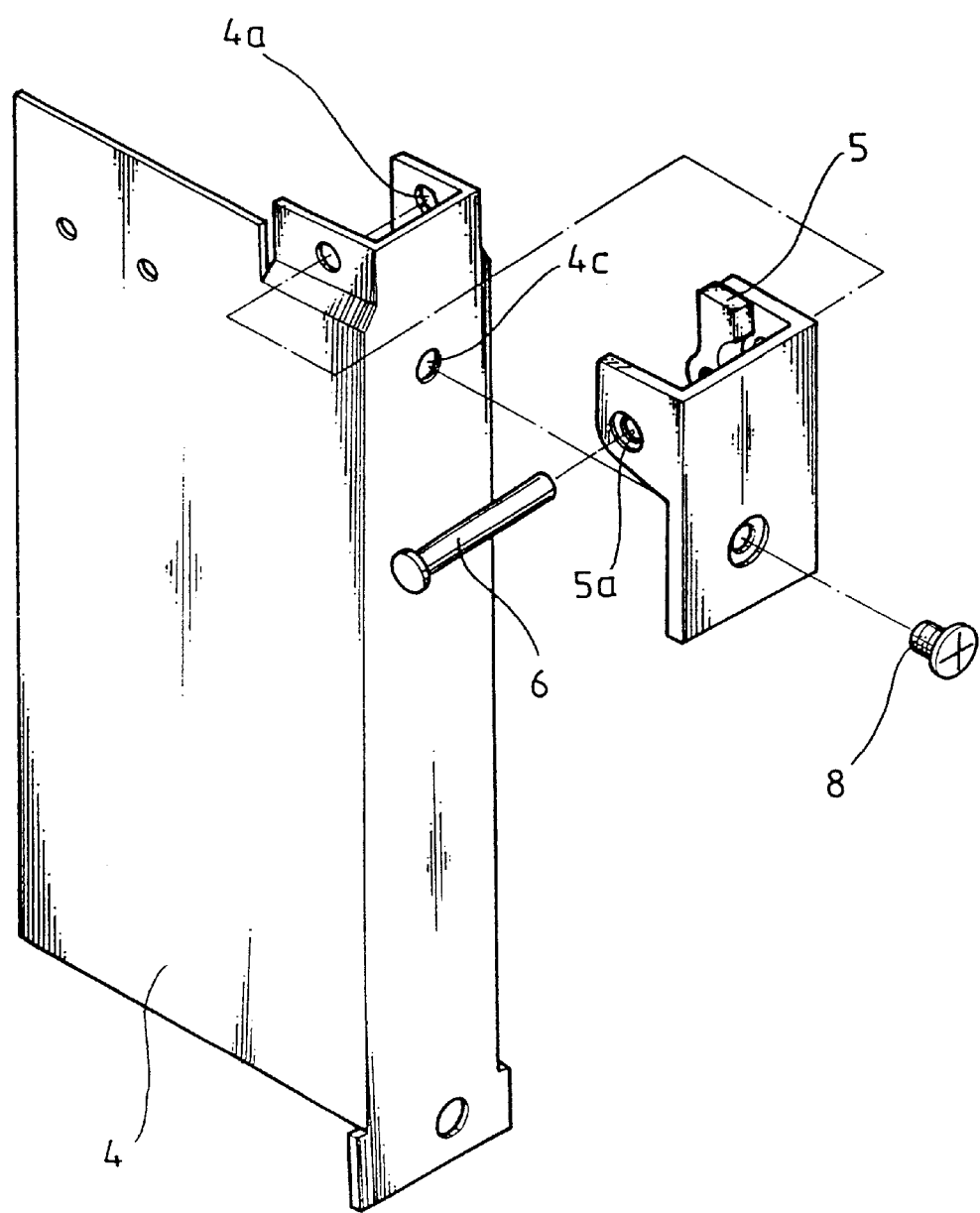
FIG. 2 is an exploded perspective view illustrating the plate and hook shown in FIG. 1.

Turning now to the drawings, FIGS. 1 and 2, a board connecting structure has a plate 4 installed at one side of an auxiliary circuit board 2 and a hooking piece 5 which is hinge-coupled to plate 4. A groove 1a into which hooking piece 5 is inserted is formed on case 1. A connecting terminal 2a of auxiliary circuit board 2 is plugged into a connector 3 which is electrically connected to a main circuit board (not shown) inside case 1. Plate 4 is coupled to auxiliary circuit board 2 by a coupling means such as a screw 7. Pin 6 is inserted through pin hole 4a and through hole 5a.

Auxiliary circuit board 2 to which plate 4 is coupled is connected to connector 3 as follows. First, connecting terminal 2a of auxiliary circuit board 2 is inserted into connector 3. Then, hooking piece 5 is inserted into groove 1a of case 1 and hooking piece 5 is fixed to plate 4 by bolt 8. Thus, auxiliary circuit board 2 is prevented from disconnecting from connector 3 due to impact from the outside.

Figure 3:
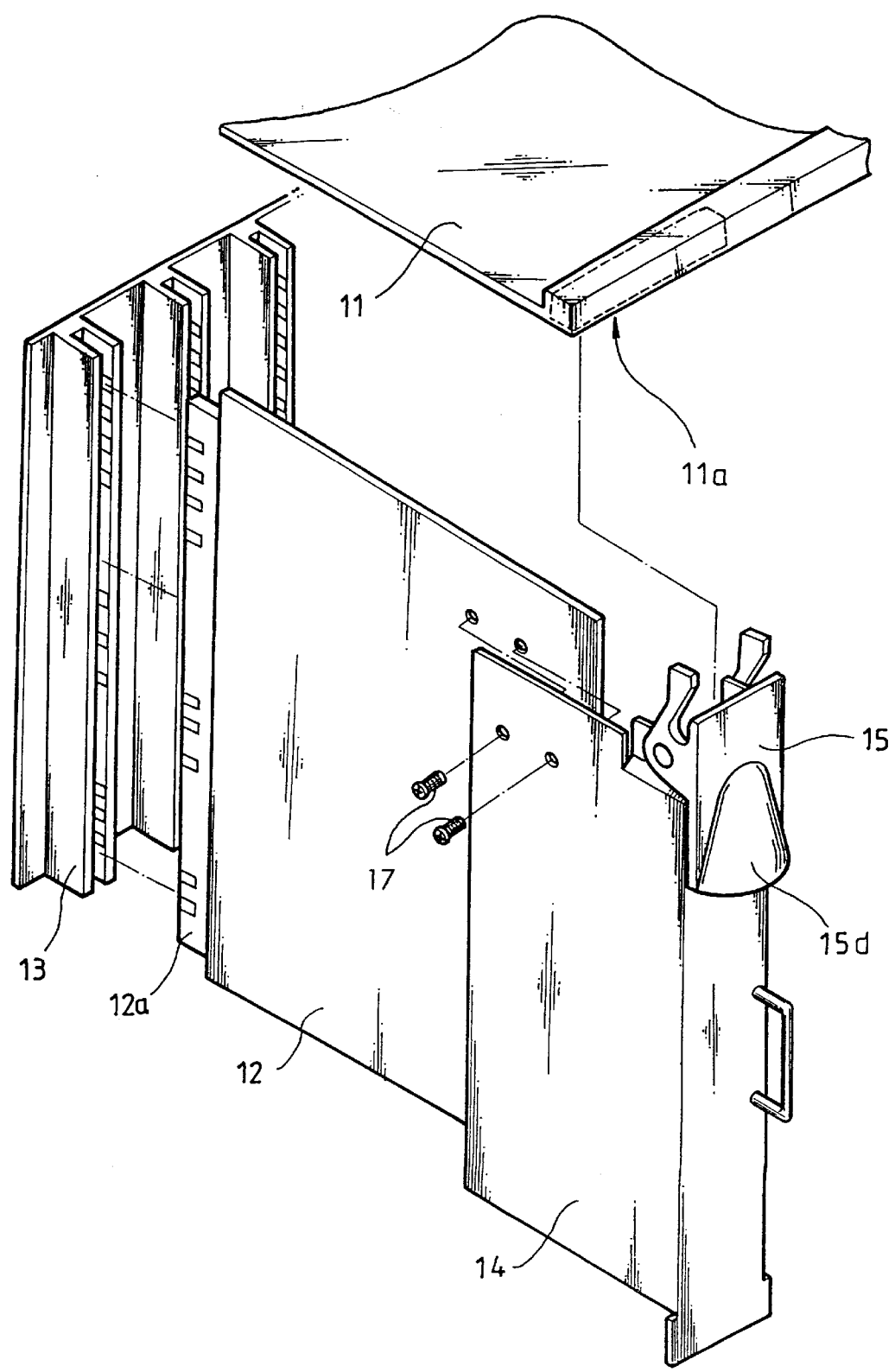
FIG. 3 is an exploded perspective view illustrating a board connecting structure constructed according to the principles of the present invention.
Figure 4:
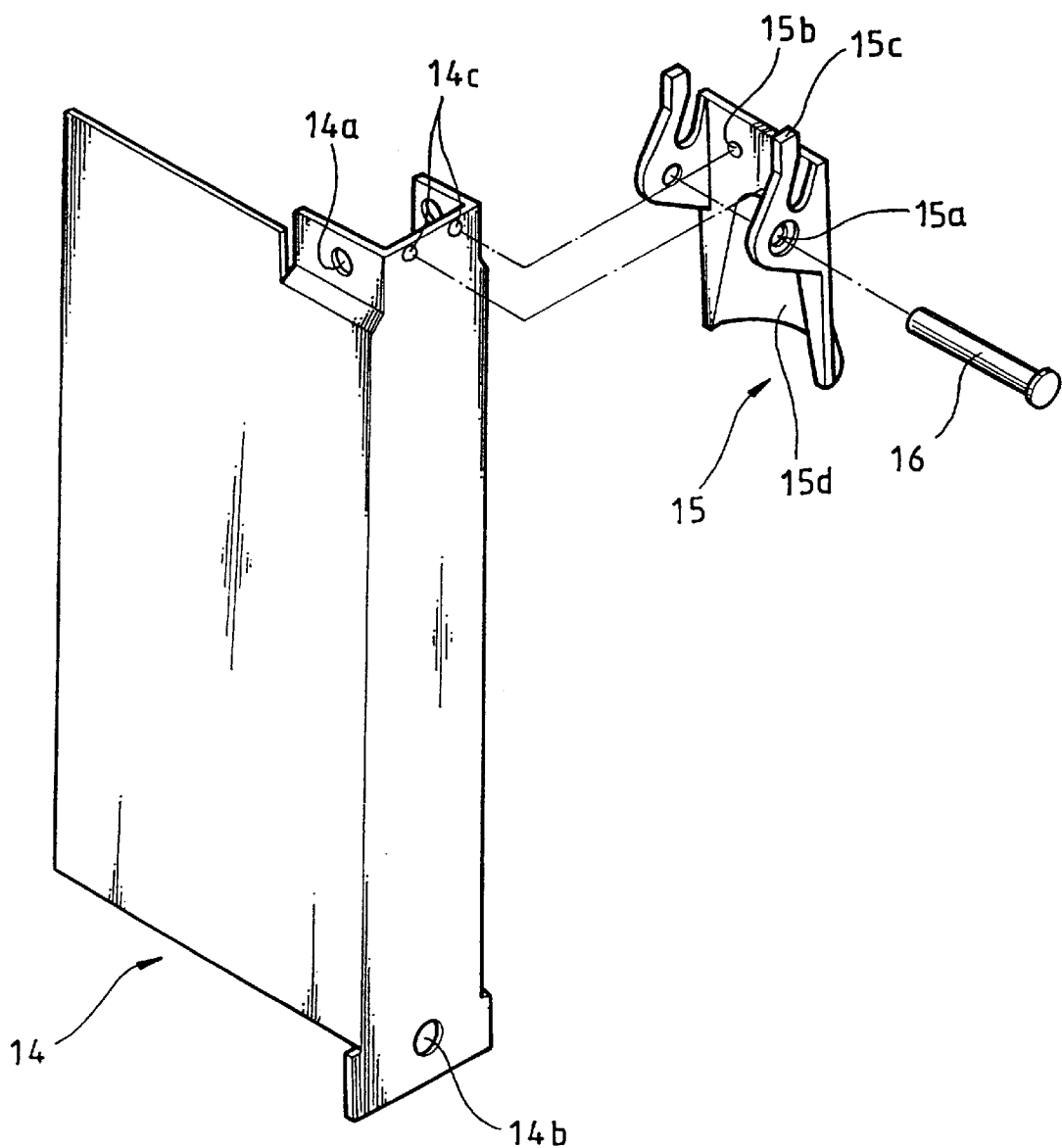
FIG. 4 is an exploded perspective view illustrating the plate and hooking piece illustrated in FIG. 3.

Referring now to FIGS. 3 and 4, a board connecting structure of the present invention includes a plate 14 coupled to an auxiliary circuit board 12 by screws 17 and latch 15 hinge-coupled to plate 14. A connecting terminal 12a of auxiliary circuit board 12 is plugged into a connector 13 which is electrically connected to a main circuit board (not shown). Latch 15 is inserted into a groove 11a formed in a case 11.

It is a characteristic feature of the present invention that at least one dimple, or recess, 15b (see FIG. 4) is formed on the inner surface of hooking piece 15 facing a surface of plate 14 and at least one bump, or plug, 14c is formed on the surface of plate 14 at a position corresponding to coupling indentation 15b. Alternatively, the dimple may be formed on plate 14 and the bump may be formed on latch 15. Latch 15 is formed of an elastically deformable, flexible material such as synthetic resin so that bump 14c fits into dimple 15b when the two coincide. Alternatively, bump 14c is formed of a flexible material such as synthetic resin. Plate 14 and latch 15 are hinge-coupled by a pin 16 which penetrates hollow 14a and bore 15a formed at plate 14 and latch 15, respectively. Thus, latch 15 is rotatable around pin 16 within a predetermined angle with respect to plate 14. Also, handle 15d is formed in latch 15.

The installation of the board connecting structure according to the present invention will be now described as follows. First, the board connecting structure is advanced such that connecting terminal 12a of auxiliary printed circuit board 12 can be inserted into connector 13 and simultaneously latch 15 can be inserted into groove 11a formed in case 11. In this state, handle 15d of latch 15 is pressed downward to allow latch 15 to pivot around pin 16 so that prong 15c of latch 15 enters groove 11a in case 11. As latch 15 rotates, bump 14c formed in plate 14 contacts a surface around dimple 15b formed on latch 15. Thereafter, when latch 15 is continuously pressed to further rotate with a force greater than the repelling power generated by bump 14c, the bump 14c fittingly inserts into dimple 15b since latch 15 is formed of a flexible material. At the same time, the inner surface of latch 15 contacts the surface of plate 14 so that rotation of latch 15 stops, as shown in FIG. 5b. Dimple 15b and bump 14c undergo elastic deformation upon engagement. Surface 15e of latch 15 mates with interior mating surface 11b of case 11 upon engagement, As is shown in FIG. 5a, when latch 15 is rotated in the opposite direction in order to remove the printed circuit board connecting structure from the main circuit board, prong 15c of latch 15 comes out from groove 11a of case 11 while bump 14c is separated from from dimple 15b by forces caused from undergoing elastic deformation. Then, auxiliary circuit board 12 is unplugged from connecter 13.

The foregoing paragraphs describe process and structure using protrusions and detents to facilitate latching and unlatching of a lever piece on the circuit board. As described, the board connecting structure of the present invention enables an auxiliary circuit board can be easily installed into and removed from the connector by the action of coupling the coupling protrusion and the coupling indentation by rotating the hooking piece.

What is claimed is:

1. A device, comprising:
   a printed circuit board;
   a case enclosing said printed circuit board and having a groove;
   a connector attached to said case for electrically engaging said printed circuit board;
   a plate connected to said printed circuit board and having a bump on an edge; and
   a latch pivotally attached to said plate and having a prong on one end and a dimple disposed on said latch for insertably receiving said bump on said plate;
   said printed circuit board securable when said latch is pivoted to engage said prong with said groove in said case while simultaneously engaging said bump on said plate with said dimple in said latch.

2. The device of claim 1, wherein a handle is formed on a side of said latch.

3. The device of claim 1, wherein said latch is formed of a flexible material.

4. The device of claim 3, further comprised of said dimple on said latch engaging with said bump on said plate by undergoing elastic deformation.

5. The device of claim 1, wherein said bump is formed of a flexible material.

6. The device of claim 5, further comprised of said dimple on said latch engaging with said bump on said plate by undergoing elastic deformation.

7. A device, comprising:
   a printed circuit board;
   a case enclosing said printed circuit board and bearing a groove;
   a connector attached to said case for engaging said printed circuit board;
   a plate connected to said printed circuit board and bearing a protruding plug; and
   a latch rotatably attached to said plate and bearing a recess disposed for engaging said plug, said latch rotatable between a first position engaging said groove in said case and a second position disengaged from said groove in said case.

8. The device of claim 7, further comprised of said plug on said plate being along an edge facing said latch.

9. The device of claim 7, further comprised of said recess being located on a side of said latch facing said edge of said plate.

10. The device of claim 7, further comprising said latch having a handle.

11. The device of claim 7, further comprised of said latch being formed of a flexible material.

12. The device of claim 7, further comprising said recess on said latch engaging said plug on said plate by elastic deformation.

13. A device, comprising:
    a printed circuit board;
    a case enclosing said printed circuit board and having a groove;
    a connector attached to said case for engaging an edge of said printed circuit board;
    a plate connected to a second edge, opposite from said first edge, of said printed circuit board and bearing a plug on a side opposite from said printed circuit board;
    a latch pivotally attached to an end of said plate and having a prong and having a dimple disposed on said latch for insertably receiving said bump on said plate;
    said printed circuit board securable when said latch is pivoted to engage said prong with said groove in said case while simultaneously engaging said plug on said plate with said dimple in said latch, said printed circuit board being releasable from said connector by rotating said latch to disengage said prong from said groove in said case.

14. The device of claim 13, wherein a handle is formed on a side of said latch.

15. The device of claim 14, wherein said latch is formed of a flexible material.

16. The device of claim 15, further comprised of said dimple on said latch engaging with said bump on said plate by undergoing elastic deformation.

17. The device of claim 16, wherein said bump is formed of a flexible material.

* * * * *